(12) United States Patent
Hidaka et al.

(10) Patent No.: US 6,633,207 B1
(45) Date of Patent: Oct. 14, 2003

(54) CONTINUOUS TRANSMISSION LINE WITH BRANCH ELEMENTS, RESONATOR, FILTER, DUPLEXER, AND COMMUNICATION APPARATUS FORMED THEREFROM

(75) Inventors: Seiji Hidaka, Nagaokakyo (JP); Michiaki Ota, Nagaokakyo (JP); Shin Abe, Muko (JP)

(73) Assignee: Murata Manufacturing Co. Ltd (JP)

( * ) Notice: Subject to any disclaimer, the term of this patent is extended or adjusted under 35 U.S.C. 154(b) by 0 days.

(21) Appl. No.: 09/556,120

(22) Filed: Apr. 19, 2000

(30) Foreign Application Priority Data

Apr. 19, 1999 (JP) ............................................. 11-110884

(51) Int. Cl.[7] ........................ H01P 1/213; H01P 1/203; H01P 7/08; H01P 3/08
(52) U.S. Cl. ...................... 333/134; 333/204; 333/219; 333/238; 333/99 S
(58) Field of Search ............................... 333/99 S, 238, 333/204, 219, 134; 505/210, 700, 701, 866

(56) References Cited

U.S. PATENT DOCUMENTS

| 3,758,878 A | * | 9/1973 | Wainwright | ............ 333/238 X |
|---|---|---|---|---|
| 3,875,538 A | * | 4/1975 | Minet et al. | ............ 333/238 X |
| 4,521,755 A | | 6/1985 | Carlson et al. | ............. 333/244 |
| 5,777,532 A | * | 7/1998 | Lakin | ..................... 333/238 X |
| 5,869,429 A | * | 2/1999 | Das | ........................ 333/205 X |

FOREIGN PATENT DOCUMENTS

| CA | 2249489 | 4/1999 |
|---|---|---|
| JP | 57171806 | 10/1982 |
| JP | 08321706 | 12/1996 |
| WO | 4-276905 | 10/1992 |

OTHER PUBLICATIONS

Japanese Examination Report dispatched on Aug. 13, 2002 (w/ relevant English translation).
European Search Report dated Jan. 28, 2002.

* cited by examiner

Primary Examiner—Benny Lee
(74) Attorney, Agent, or Firm—Dickstein, Shapiro, Morin & Oshinsky, LLP.

(57) ABSTRACT

A transmission line, a resonator, a filter, a duplexer, and a communication apparatus efficiently minimize power losses due to edge effects, thereby having superior loss-reduction characteristics. A continuous line and a plurality of thin lines each having a predetermined length and branching from both sides of the continuous line are formed on a dielectric substrate. With this structure, edges of the individual thin lines substantially do not exist, so that losses due to edge effects can be efficiently minimized.

11 Claims, 21 Drawing Sheets

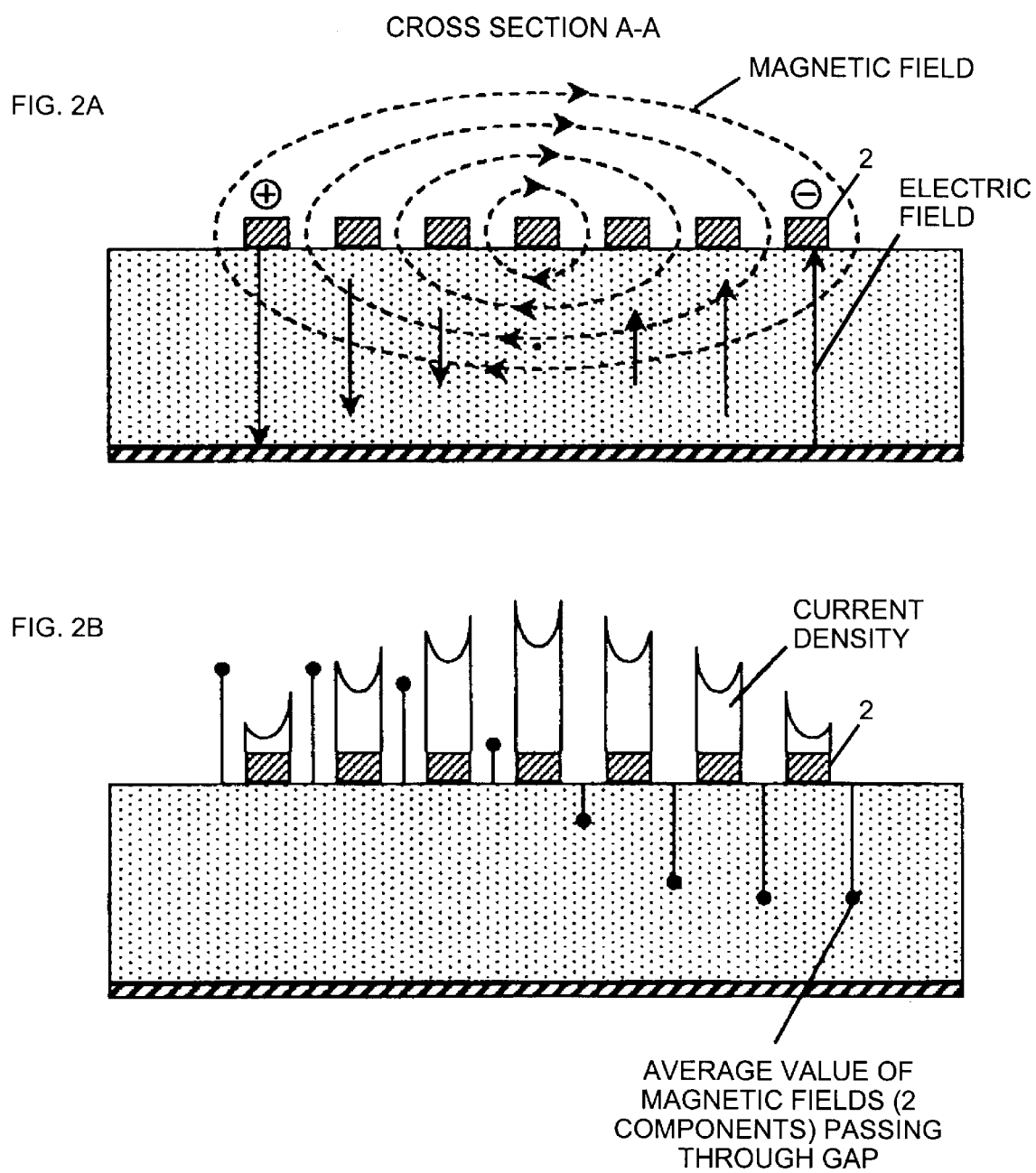

CROSS SECTION A-A

FIG. 4A
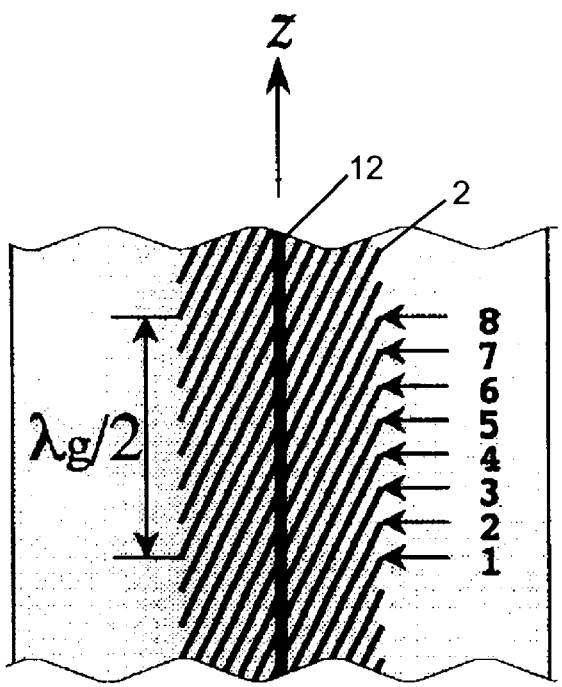
VOLTAGE AMPLITUDE
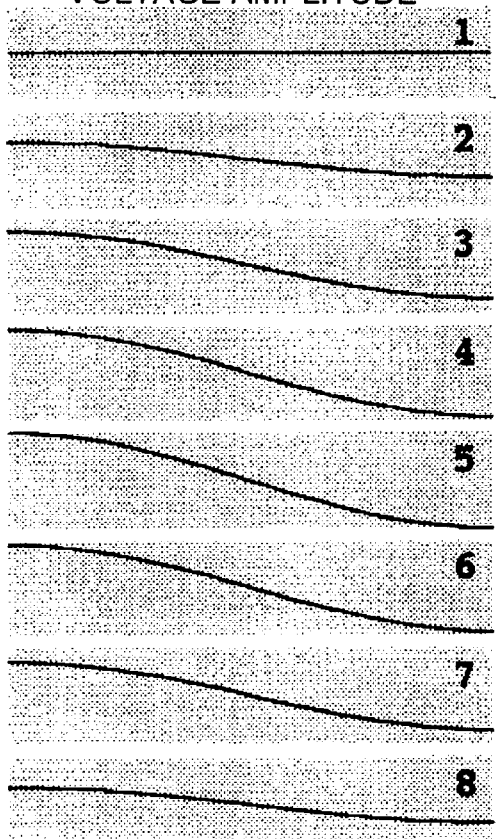
FIG. 4B
CURRENT AMPLITUDE
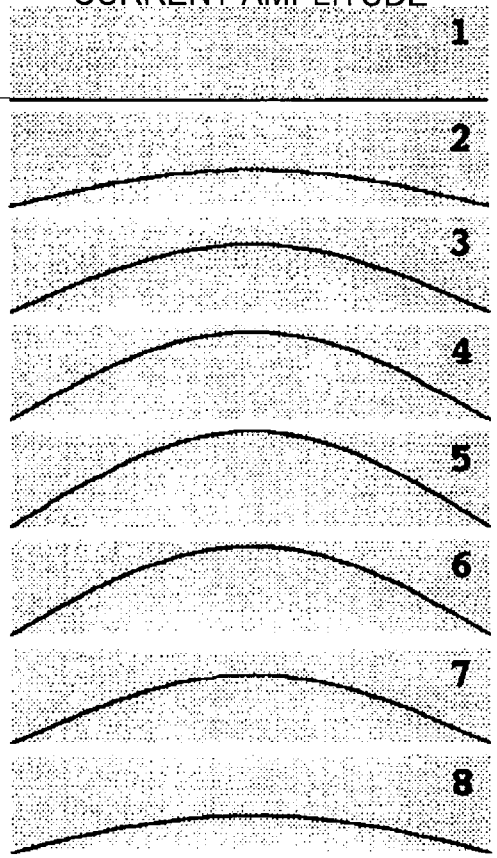
FIG. 4C absH absH1

Hx0

Hx1

Hy0

Hy1

5 INPUT TERMINAL      5 OUTPUT TERMINAL

CONTINUOUS TRANSMISSION LINE WITH BRANCH ELEMENTS, RESONATOR, FILTER, DUPLEXER, AND COMMUNICATION APPARATUS FORMED THEREFROM

BACKGROUND OF THE INVENTION

1. Field of the Invention

The present invention relates to a transmission line, a resonator, a filter, a duplexer, and a communication apparatus used for radio communication and for transmitting and receiving electromagnetic waves in, for example, microwave bands and millimeter-wave bands.

2. Description of the Related Art

Ordinary RF circuits employ planar circuits that use transmission lines, such as microstrip lines, which can be easily produced and that are suitable for being miniaturized and made thin.

In the microstrip line, however, current concentration due to surface effects occurs on a conductor surface. Particularly, it is apparent at the edges, causing a power loss in a narrow region in a range of several micrometers ($\mu$m) to several tens of micrometers ($\mu$m) around the edges, accounting for 50% of the entire power loss. This phenomenon, called an edge effect, is attributed to the cross-sectional shape of the conductor (electrode). In planar circuits in which electrodes, such as microstrip lines, are formed on a substrate, edges always exist. Therefore, the problem of power loss due to the edge effect always occurs and is known to be unavoidable.

In this connection, RF transmission lines for aiming to reduce the current concentration at the conductor edges were suggested as disclosed in (1) Japanese Unexamined Patent Application Publication No. 8-321706 and (2) Japanese Unexamined Patent Application Publication No. 10-13112.

In each of the above publications, a plurality of linear conductors is formed at a constant pitch, parallel to a signal-propagation direction. It can be said that, in the above-described conventional transmission lines, the conductor is divided parallel to the signal-propagation direction to reduce the current concentration at the edges. However, to form the conductors with the correct line width in these structures requires very severe manufacturing accuracy, on the same order of magnitude as the skin depth. In addition, the conductor Q value is improved only within a small range of 10 to 20% of the conventional Q value. Further, depending on the dividing method, there are cases where the conductor Q value decreases, so that it is actually lower than the Q value of a single-line conductor.

Thus, in the structure in which the direction of a current path is the same as the signal-propagation direction, even when the linewidth is divided to be as thin as possible, the left and right edges still exist. Therefore, the structures are not effective enough as a fundamental solution to the edge effect problem.

SUMMARY OF THE INVENTION

In view of the above, an object of the present invention is to provide a transmission line, a resonator, a filter, a duplexer, and a communication apparatus that efficiently minimize power losses due to edge effects, thereby having superior loss-reduction characteristics.

In order to achieve the above object, a transmission line of an embodiment of the present invention is configured of at least one continuous line and a plurality of thin lines each branching from the continuous line and having a predetermined length.

According to this structure, other thin lines having the same shape may be arranged adjacent to the one thin line. In this case, since physical edges exist when microscopically viewed, a weak edge effect occurs at the edge of each of the thin lines. However, when the plurality of the lines are macroscopically viewed as a whole, the edge on the left side of one of the connected thin lines exists adjacent to, for example, the right edge of another one of the connected thin lines. Therefore, substantial edges in the line width direction do not exist; that is, the edge is not noticeable. This allows the current concentration at the edges of the lines to be efficiently reduced, thereby minimizing the entire power loss.

The thin lines do not deteriorate the transmission characteristics of the transmission line since the successive thin lines together function as a single high-frequency transmission line. Because respective ends of the thin lines are connected to a common continuous line, current transmitted in the continuous line flows into the respective transmission lines. Therefore, magnetic fields are induced around the respective thin lines. Due to the coupling between the magnetic fields, the thin lines are electromagnetically coupled with each other. As a result, a high frequency signal can be propagated via the successive thin lines along the extension direction of the continuous line.

Also, in the transmission line of the present invention, the branching direction of each of the thin lines may be slanted with respect to the continuous line. In this case, the direction in which the thin lines extend has a component extending in the signal-propagation direction for all of the lines, thereby allowing the edge effect to be efficiently minimized.

Also, in the transmission line of the present invention, the aforementioned individual thin lines may be connected, and the aforementioned continuous line connects identical portions of the aforementioned lines. For example, each of the thin lines is arranged to have substantially an integer multiple length of half the wavelength corresponding to the transmission frequency, and central portions of the individual thin lines are connected. With this arrangement, both ends of each of the thin lines become open ends, and portions that represent nodes in the voltage amplitudes are connected via the continuous line. Alternatively, by connecting both ends of each of the thin lines via the continuous line, both ends of each of the thin lines become short-circuited ends, and portions that represent antinodes in the current amplitudes are connected.

According to these structures, electromagnetic-field distributions (voltage and current distributions) on the individual thin lines are forced by the continuous line to be uniform. This increases the efficiency of the reduction of the edge effect due to the close arrangement of the individual thin lines.

Also, in the transmission line of the present invention, the thin lines may be curved lines, and a controlled capacitive coupling or mutual dielectric coupling between each pair of thin lines may be arranged.

Also, in the transmission line of the present invention, a line width of each of the thin lines may be not more than the skin depth of a conductor of each of the lines. By this structure, currents that flow to maintain magnetic fields that pass through gaps between left sides and right sides of the individual lines are spaced apart by suitable distances so as to cause interference at the left sides and the right sides thereof. This minimizes reactive currents deviating in phase, thereby allowing the power loss to be significantly reduced.

Also, in the transmission line of the present invention, each of the thin lines may be a thin-film multilayered electrode, having overlaid thin-film dielectric layers and thin-film conductor layers. By this, the skin effect in the direction from the substrate surface to the outside of the electrode can be reduced. This allows a further reduction in the power loss to be obtained.

Also, in the transmission line of the present invention, a dielectric material may be filled in each gap between the adjacent thin lines. By this, short-circuiting between lines is prevented, including when the lines comprise thin-film multilayered electrodes as described above.

Also, in the transmission line of the present invention, at least one of the individual lines of the aforementioned thin lines may be configured using a superconductor. In this case, the low-loss characteristics of the superconductor advantageously allow a high Q value to be obtained at a level lower than a critical current density.

A resonator according to an embodiment of the present invention is configured using the aforementioned transmission line as a resonant line. This allows a resonator having a high unloaded Q value to be obtained.

Also, a filter of an embodiment of the present invention is configured by providing a signal input/output section in the aforementioned resonator. This provides a filter that is small and produces a small amount of insertion loss.

In addition, a duplexer of an embodiment of the present invention is configured using the aforementioned filter as at least one of a transmitting filter and a receiving filter. By this, a small duplexer that produces a small amount of insertion loss and that is small can be obtained.

Furthermore, a communication apparatus of an embodiment of the present invention is configured using at least one of the aforementioned filters and duplexer. In such a communication apparatus insertion losses in RF transmitter and receiver portions can be reduced, and also, quality in communication with respect to, for example, transmission speeds, can be improved.

Other features and advantages of the present invention will become apparent from the following description of embodiments of the invention which refers to the accompanying drawings.

BRIEF DESCRIPTION OF THE DRAWINGS

FIGS. 2A and 2B show an example electromagnetic-field distribution in the transmission line;

FIG. 4A shows a portion of the transmission line and FIGS. 4B and 4C show exemplary amplitude distributions of current and voltage in the transmission line;

DESCRIPTION OF EMBODIMENTS OF THE INVENTION

Figure 1A:
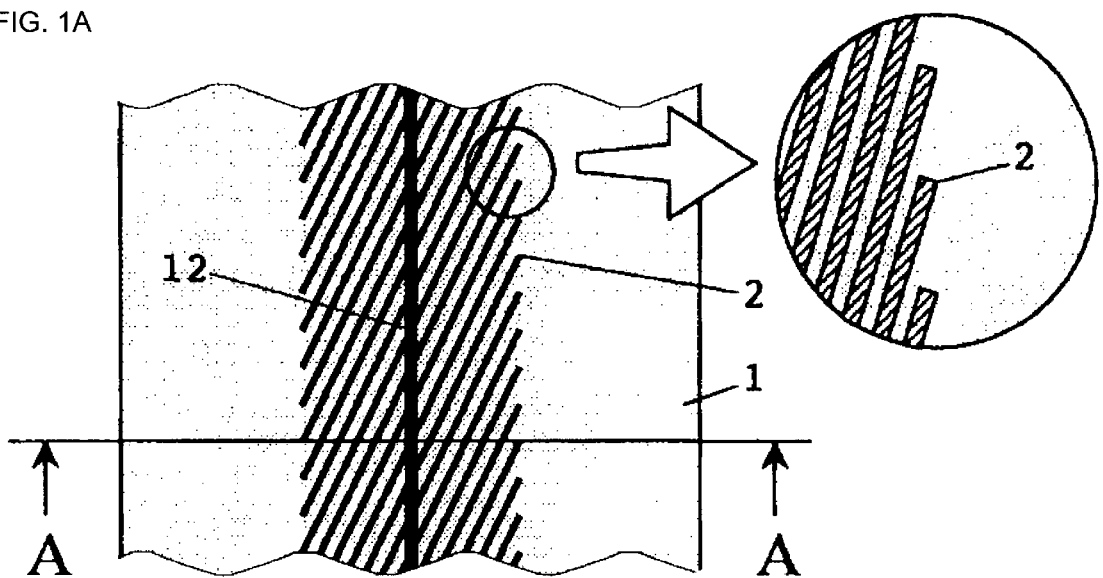
FIGS. 1A and 1B are views showing a configuration of a transmission line according to a first embodiment.

Hereinbelow, referring to the drawings, a description will be given of embodiments of a transmission line, a resonator, a filter, a duplexer, and a communication apparatus according to the present invention.

Principles and First Embodiment (FIGS. 1A to 8B)

Figure 1B:
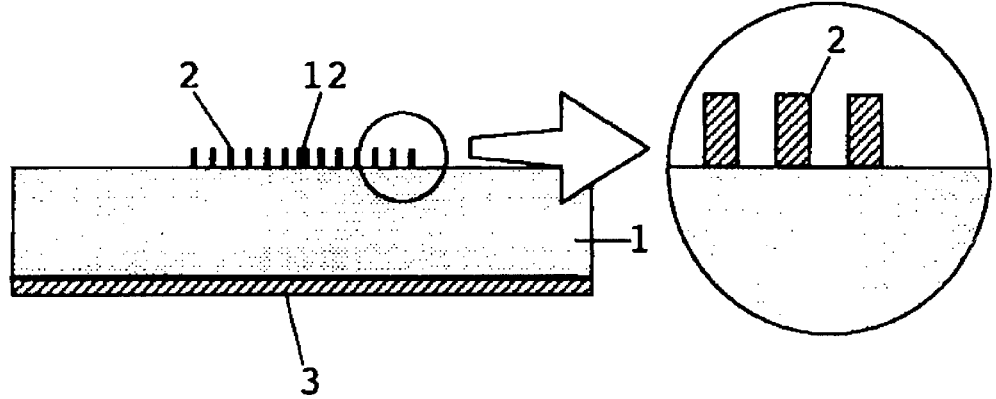

FIG. 1A is a top view of a configuration of a transmission line, FIG. 1B is a cross-sectional view along line A—A, and individual enlarged views thereof are shown on the right. In FIGS. 1A and 1B, a ground electrode 3 (see FIG. 1B) is formed on the entire lower surface of a dielectric substrate 1. Thin lines 2 and a continuous line 12 are formed on the upper surface of the dielectric substrate 1. Here, the linewidth of the thin lines 2 is arranged to be substantially the same as the skin depth.

Each of the thin lines 2 is a line having both ends open that has a wavelength that is half of the wavelength corresponding to the transmission frequency of the thin line 2, and they are arranged at identical pitches in parallel with each other in a state where they are slanted along a signal-propagation direction. The continuous line 12 is formed along the signal-propagation direction so that central portions of the individual thin lines 2 are connected to each other. In other words, the thin lines 2, each having a predetermined length, branch from both the left and right sides of the continuous line 12.

FIGS. 2A and 2B show an example of electromagnetic fields and current distributions in the thin lines 2. To make the figures clear, however, the figures show a reduced number of the thin lines 2. FIG. 2A shows distributions of electric fields and magnetic fields in the cross section through line A—A at a moment when the charge at the left end and the right end of each thin line 2 is at its maximum. Also, FIG. 2B shows average values of z components (in the vertical direction) of the magnetic field that pass through between the individual lines and the current density in the individual lines.

As shown in FIG. 2B, when the individual lines are microscopically viewed with current flowing therein, the current density increases at the individual edge sections. However, when they are viewed in the cross-sectional direction, it is seen that the thin lines 2 are arranged at a constant pitch and that each thin line 2 has substantially the same level of amplitude and phase at both the left and right edges thereof. Therefore, the edge effect is reduced. Specifically, when the thin lines 2 are viewed as a single line, the current is distributed effectively in the form of a sine wave in which the left edge and the right edge are nodes and the central portion is an antinode; and, when viewed macroscopically, there is effectively no edge effect.

Figure 3A:
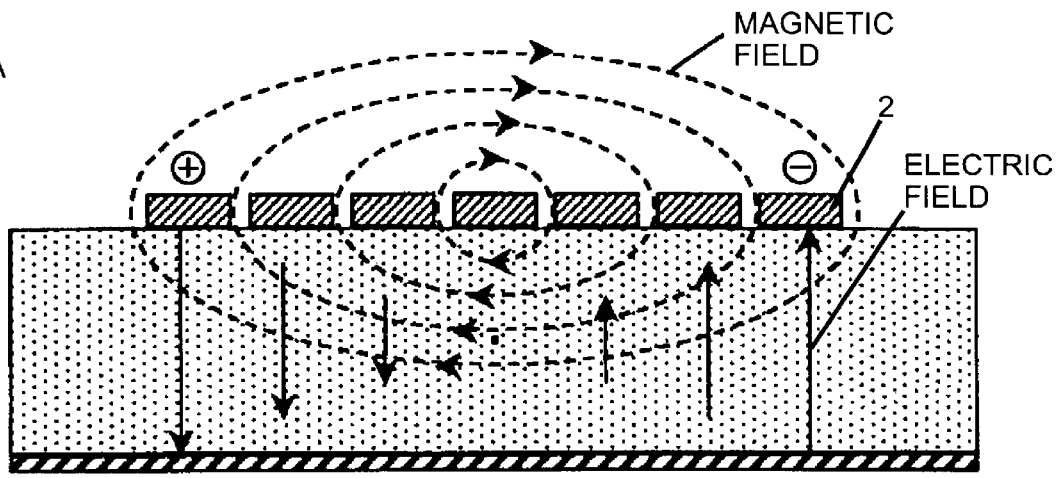
FIGS. 3A and 3B show an example electromagnetic-field distribution in another transmission line.
Figure 3B:
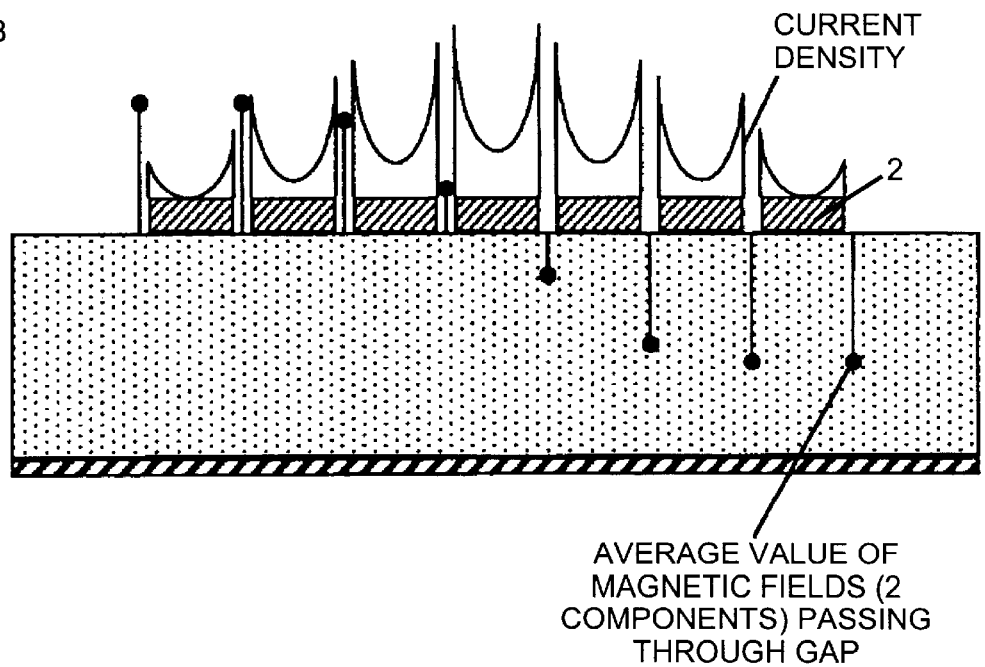

FIGS. 3A and 3B show an example for comparison to FIGS. 2A and 2B and containing identical references. In FIGS. 3A and 3B, the linewidth of each of the lines shown in FIGS. 2A and 2B is increased to several times the skin depth. When the linewidth is thus increased, current concentration due to the edge effect on each of the individual conductors becomes apparent, and the loss-reduction effect decreases.

FIG. 4A shows a portion of the transmission line and FIGS. 4B and 4C show an example of distributions of voltage and current, respectively, in eight adjacent thin lines. As shown in FIG. 4A, the thin lines 2 numbered from 1 to 8 each correspond to a line length of $\lambda_g/2$ when the wavelength is $\lambda_g$. Thus, corresponding to amplitudes of the voltage and the current carried on the continuous line 12 at the center of the individual thin lines 2, standing waves of $\lambda_g/2$ resonance are excited in the individual thin lines 2.

When the thin lines 2 are viewed as a whole, both the left and right ends of the thin lines 2 that are a half-wavelength in length become open ends. Therefore, they become nodes in the current amplitude, in which current is not allowed to flow. Accordingly, there is no current flowing along the edges of the thin lines 2; thereby the edge effect is reduced. Also, the larger the number of the thin lines 2, the more continuous and smooth the current distribution in the thin lines 2; therefore, the edge effect can be efficiently reduced.

Three-dimensional analyses must be performed to obtain the distributions as shown in FIGS. 2A, 2B, 3A, 3B, 4A, 4B and 4C. FIGS. 4B and 4C show the distributions for the thin lines numbered from 1 to 8 in FIG. 4A. However, since the calculation volume is very large, rigorous analyses are difficult in practice. Instead, results of static-magnetic-field analyses performed for magnetic-field distributions produced by a plurality of line current sources are shown in which amplitudes and phases are given.

Analysis Model

Figure 5:
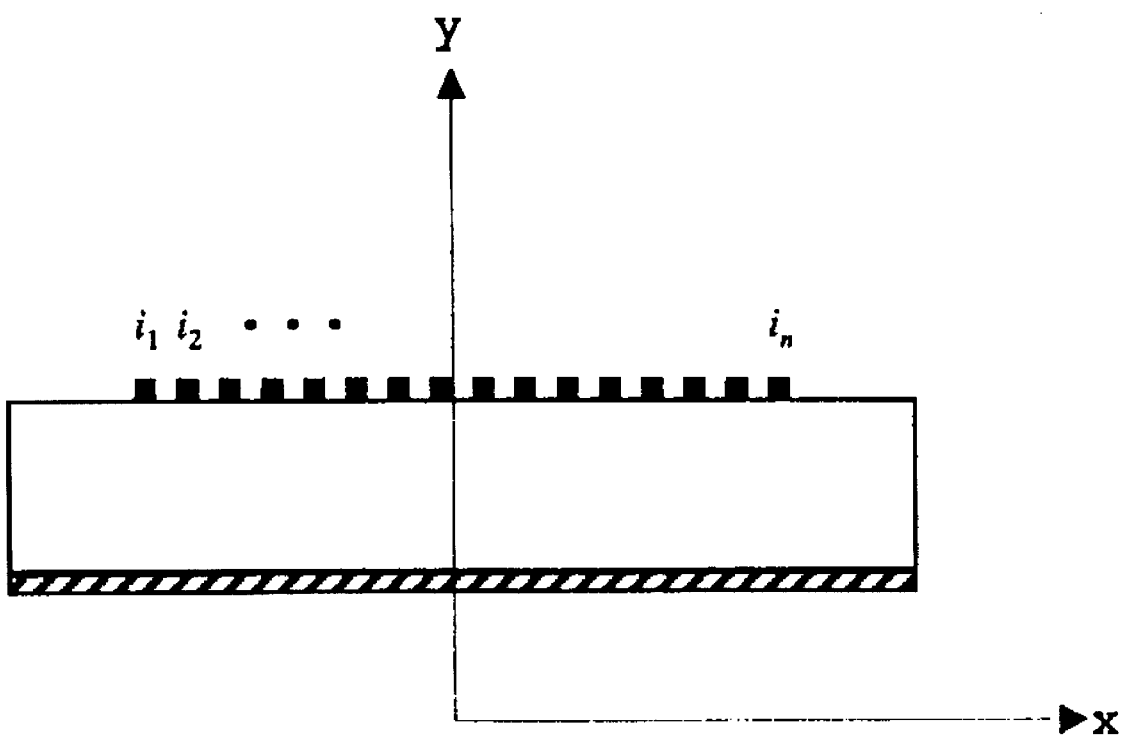
FIG. 5 shows an analysis model for magnetic-field distributions produced by a line current source.

FIG. 5 shows an analysis model of a plurality of line current sources ($i_1, i_2, \ldots i_n$). The model is shown as a cross-sectional view of a multi-microstrip line.

In Model 1 a distribution with the same phase and the same amplitude of current is used (FIG. 6A), namely:

$i_k = A/\sqrt{2}, (k=1, 2, \ldots n)$

In Model 2 a distribution with a current phase of 0 to 180° and a sinusoidal current amplitude is used (FIG. 6B), namely:

$i_k = A \sin\{(2k-1)\pi/2n\}, (k=1, 2, \ldots n)$

Calculation of Magnetic-field Distribution

Calculation of the magnetic-field distribution is performed according to the Biot-Savart law.

The magnetic-field vector H produced by a line current source that passes through a point (p) on the x-y plane and infinitely continuously flowing in a z direction is expressed by the following conventional formula (1):

Accordingly, the magnetic-field distribution produced by a plurality of line current sources in this model is expressed by the following conventional formula (2):

In the above, $P_k^{(m)}$ represents a point of an image position of $P_k$ with the ground electrode as a plane of symmetry. Also, since the current flows in the opposite direction, the second term in the formula has a negative sign.

Calculation Example

Setting Conditions:
Number of lines: n=20
Total line width: wo=0.5 mm
Thickness of the substrate: ho=0.5 mm
Coordinates of the line-current source:
$X_k = [\{(2k-1)/2n\} - (½)]wo$, and
$y_k = ho$, (where k=1, 2, ..., n)

Figure 6A:
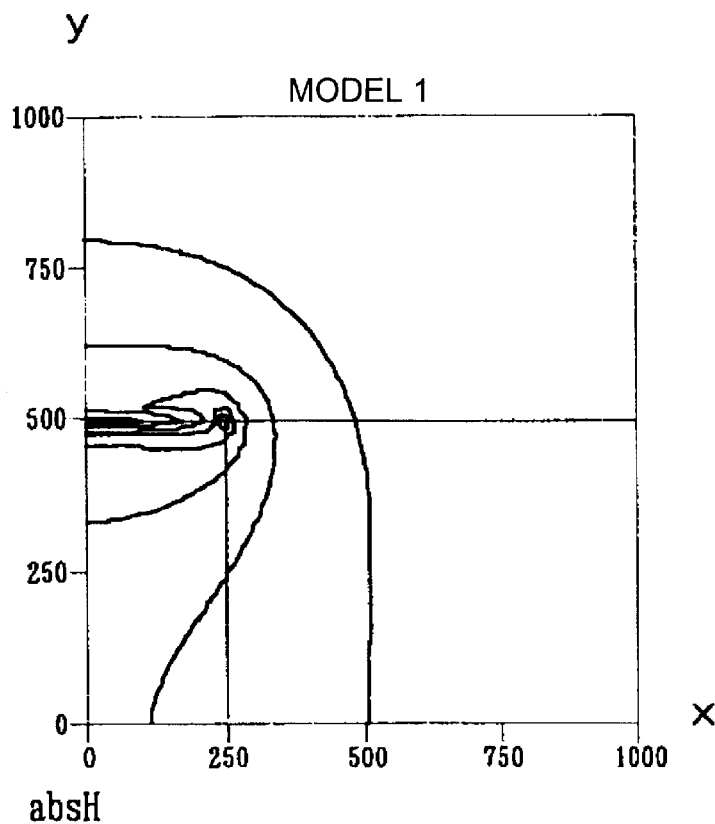
FIGS. 6A and 6B show magnetic-field strength distributions in the aforementioned model.
Figure 6B:
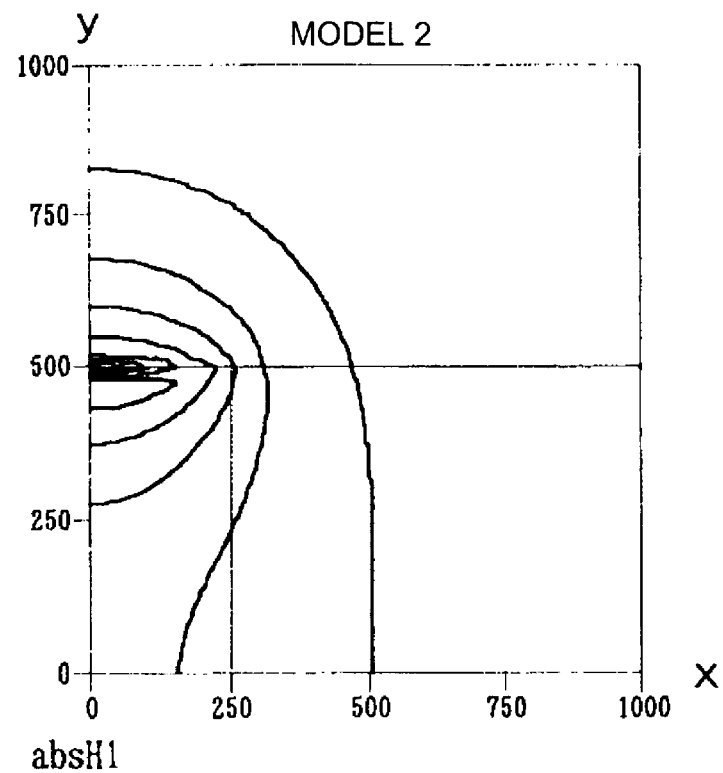

FIGS. 6A and 6B show magnetic field strength distributions of Model 1 and Model 2, respectively. In the figure, the vertical auxiliary line y represents the end of the line group, and the horizontal auxiliary line x represents the boundary surface of the substrate. From a comparison of the results, contour lines in the case of Model 2 are not much closer to each other, the surface current is low, and power loss is smaller in the case of Model 2.

Figure 7A:
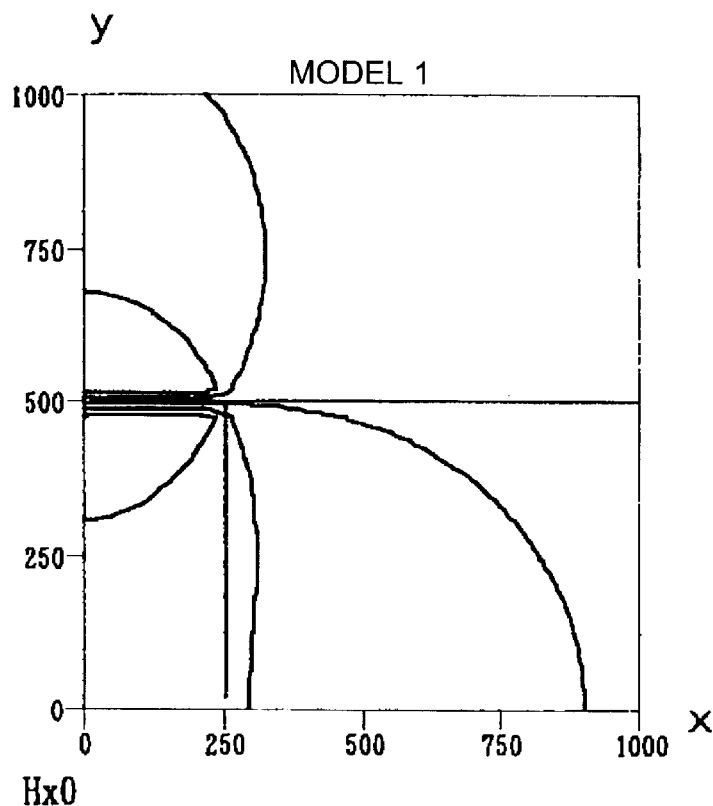
FIGS. 7A and 7B show distributions of x components of the magnetic-field amplitudes in the aforementioned model.
Figure 7B:
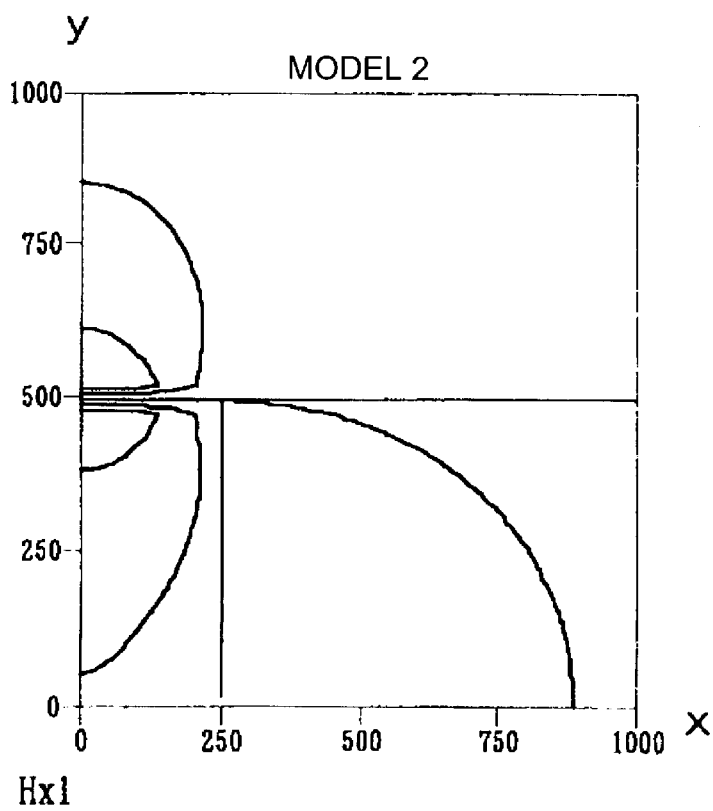

FIGS. 7A and 7B show distributions of the x component of the magnetic-field amplitude. In the figure, the vertical auxiliary line y represents the end of the line group, and the horizontal auxiliary line x represents the boundary surface of the substrate. From a comparison of the results, in the case of Model 2, the magnetic-field concentration is smaller, a significant improvement in the edge effect is obtained, and the loss-reduction characteristics are superior.

Figure 8A:
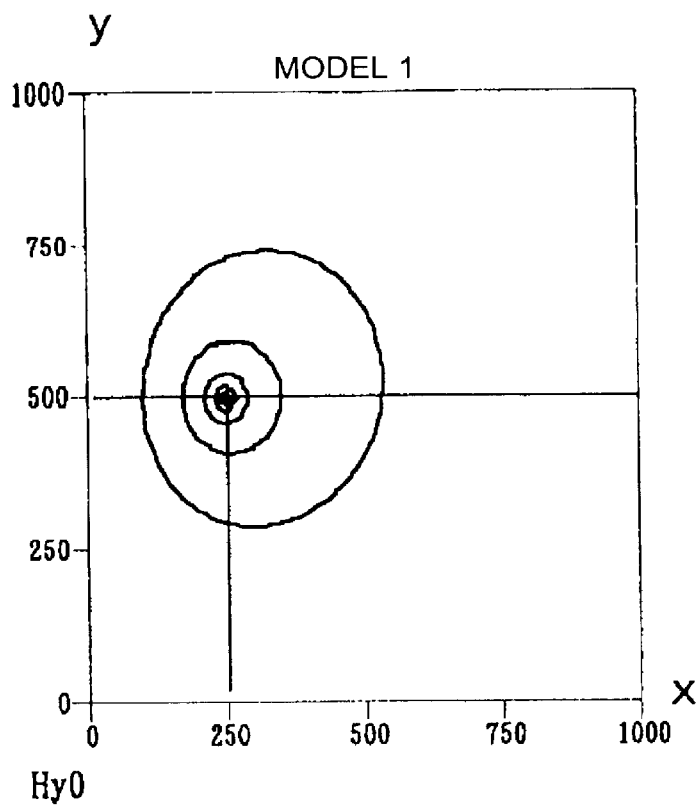
FIGS. 8A and 8B show strengths of y components of magnetic-field amplitudes in positions in the x direction.
Figure 8B:
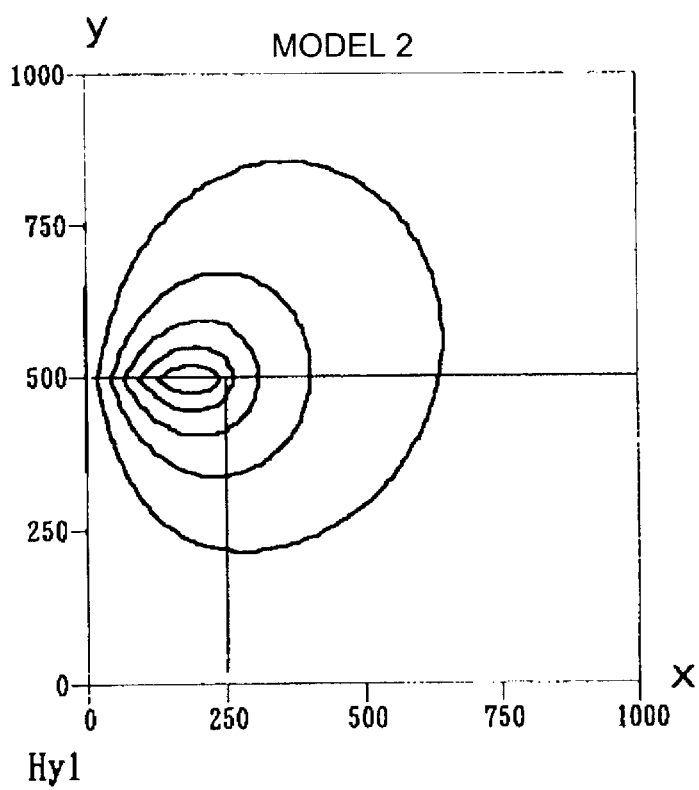

Also, FIGS. 8A and 8B show distributions of the y component of the magnetic-field amplitude shown in FIG. 5. In FIGS. 8A and 8B, the vertical auxiliary line y represents the end of the line group, and the horizontal auxiliary line x represents the boundary surface of the substrate. From a comparison of the results, Model 2 is superior in isolation; therefore, it is well suited to integration that is performed in a case where adjacent resonators are provided to configure, for example, a filter.

Figure 9A:
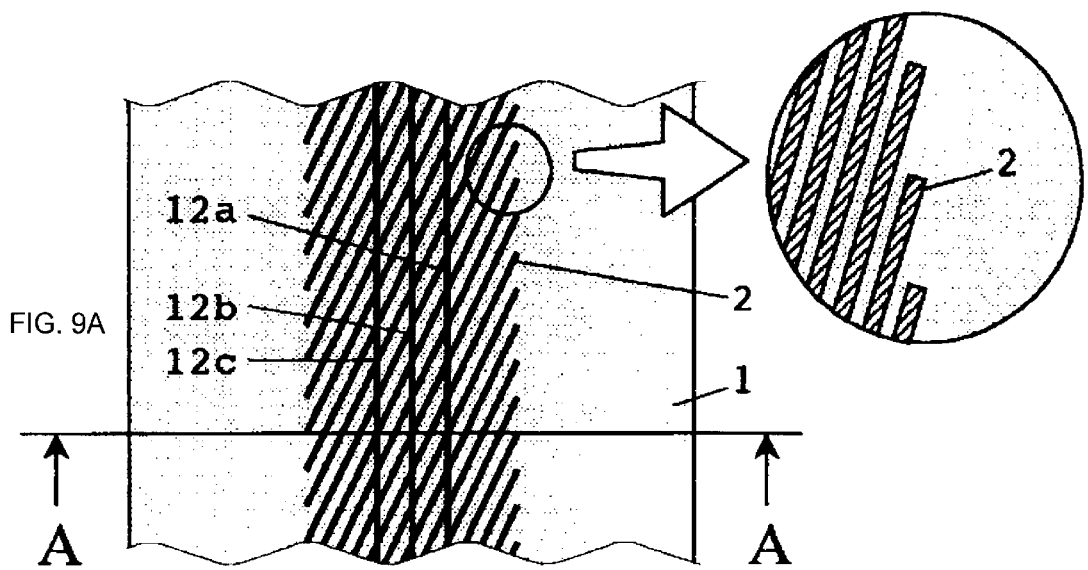
FIGS. 9A and 9B show a configuration of a transmission line according to a second embodiment.
Figure 9B:
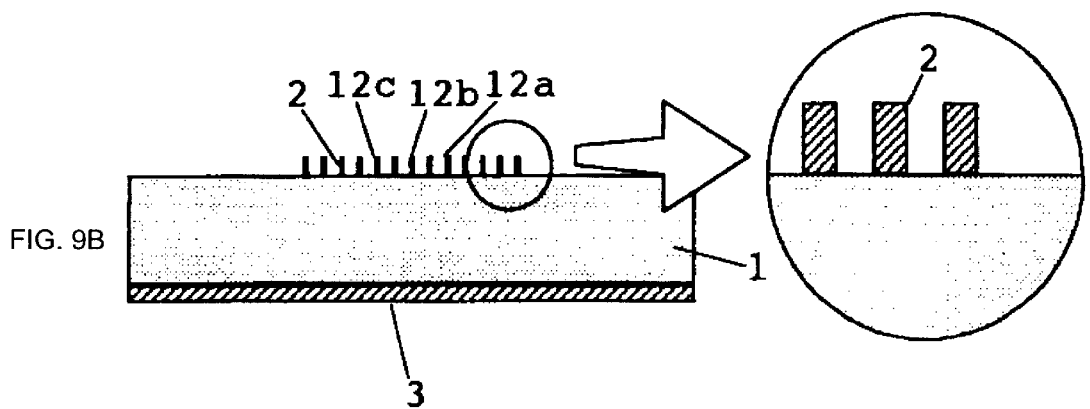

Second Embodiment (FIGS. 9A and 9B)

FIGS. 9A and 9B show a plan view and a cross-sectional view, respectively, together with partly-enlarged views thereof, of a second embodiment. As is apparent from comparison to FIGS. 1A and 1B, in this transmission line, three continuous lines 12a, 12b, and 12c are formed. The configuration of thin lines 2 is the same as in the case of FIGS. 1A and 1B. The three continuous lines 12a, 12b, and 12c connect the thin lines 2 so that corresponding portions along the length of each of the respective thin lines 2 are connected each other. Thus, identical portions of each of the individual thin lines 2, which have the same phase, are connected to each other by the three continuous lines 12a, 12b, and 12c.

Figure 10A:
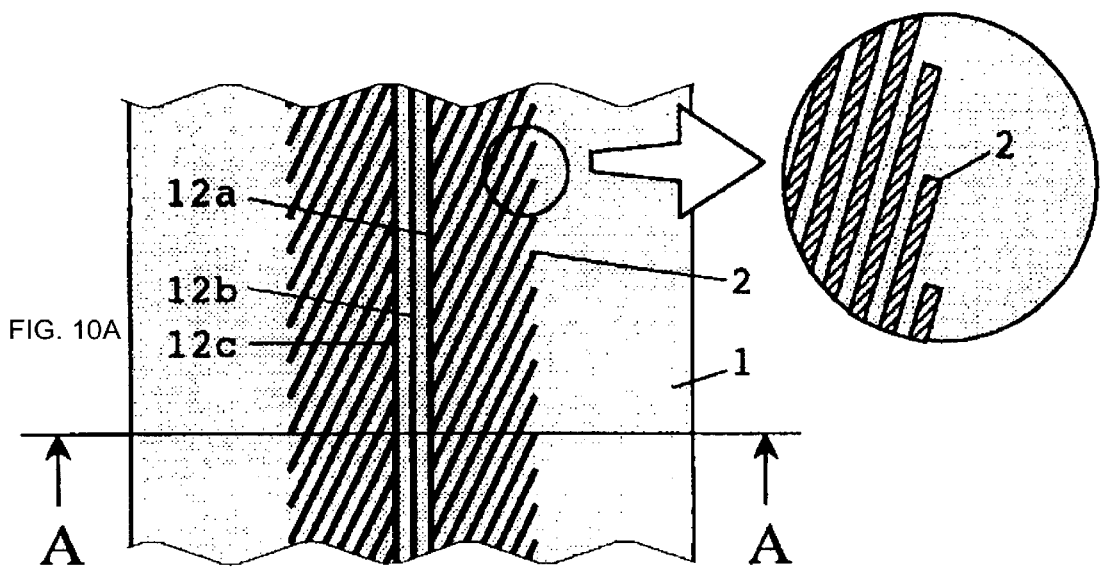
FIGS. 10A and 10B show a configuration of a transmission line according to a third embodiment.
Figure 10B:
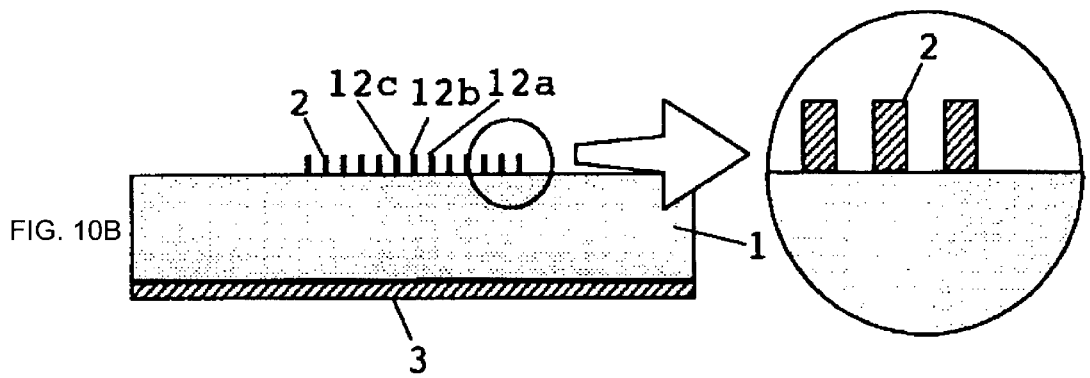

Third Embodiment (FIGS. 10A and 10B)

FIGS. 10A and 10B show a plan view and a cross-sectional view, respectively, together with partly-enlarged views thereof, of a third embodiment. As is apparent from comparison to FIGS. 1A and 1B and FIGS. 9A and 9B, in this transmission line, three continuous lines 12a, 12b, and 12c are formed; thin lines 2 branch outward only from the continuous lines 12a and 12c which are arranged at both ends of the group of three continuous lines 12a, 12b, and 12c. Also, the central continuous line 12b is isolated. According to this structure, each of the thin lines 2 works as a ¼ wavelength resonant line. The portion of each thin line 2 connected to one of the continuous lines 12a and 12c functions as a short-circuited end, and the other end portion functions as an open end. The continuous line 12b functions as a line for propagating signals.

Figure 11A:
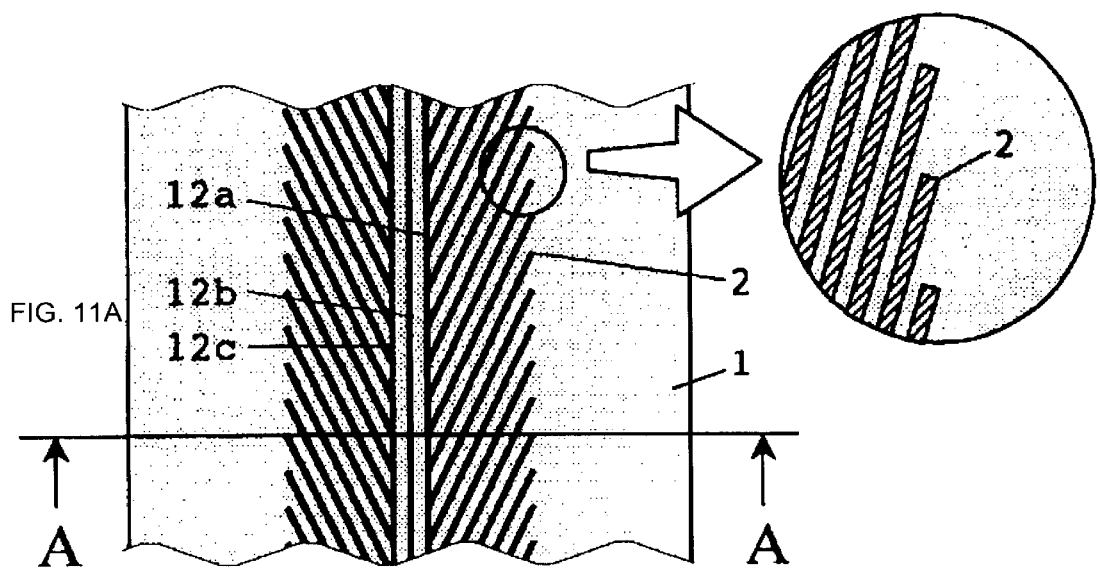
FIGS. 11A and 11B show a configuration of a transmission line according to a fourth embodiment.
Figure 11B:
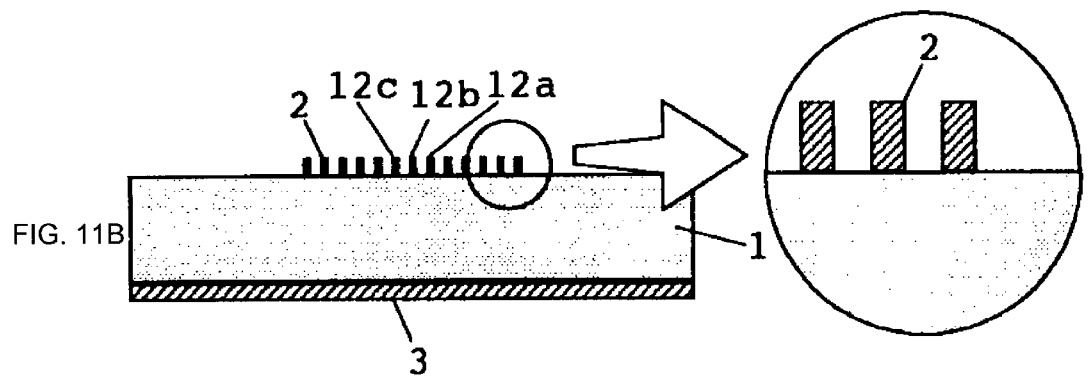

Fourth Embodiment (FIGS. 11A and 11B)

FIGS. 11A and 11B show a plan view and a cross-sectional view, respectively, together with partly-enlarged views thereof, of a fourth embodiment. As is apparent from comparison to FIGS. 10A and 10B, the thin lines 2 branch symmetrically in bilateral directions from the continuous lines 12a and 12c on both sides of the group of three continuous lines 12a, 12b, and 12c. With this structure, each of the thin lines 2 works as a ¼ wavelength resonant line. The portion of each thin line 2 connected to one of the continuous lines 12a and 12c functions as a short-circuited end, and the other end portion functions as an open end. The continuous line 12b functions as a line for propagating signals.

Fifth Embodiment (FIGS. 12A to 13B)

Figure 12A:
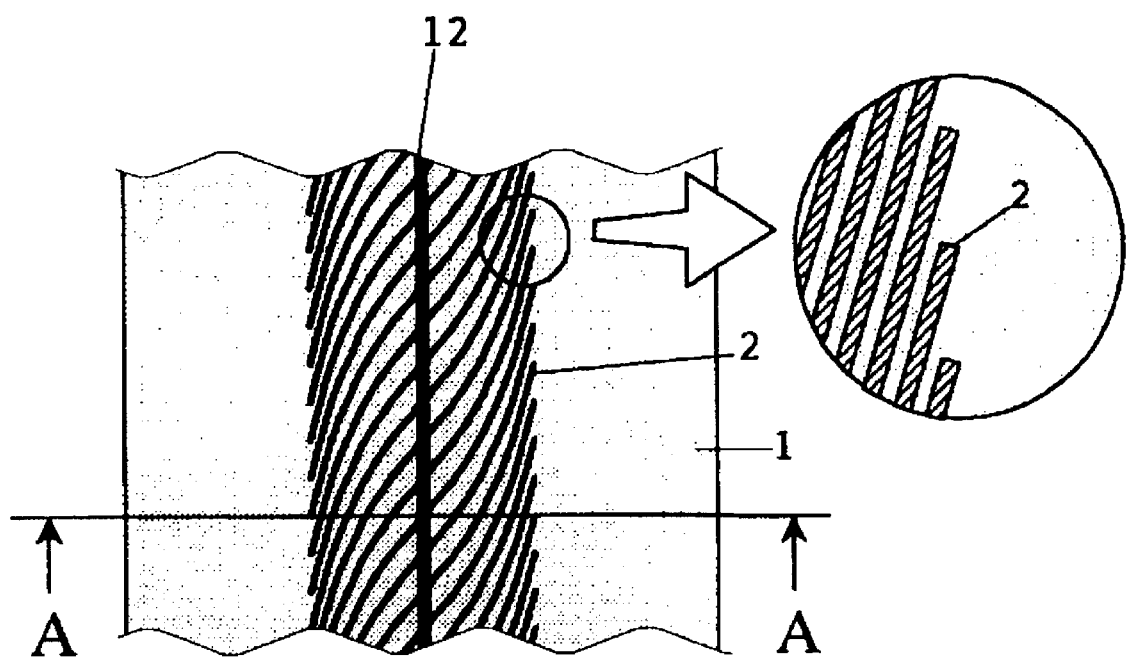
FIGS. 12A and 12B show configurations of a transmission line according to a fifth embodiment.
Figure 12B:
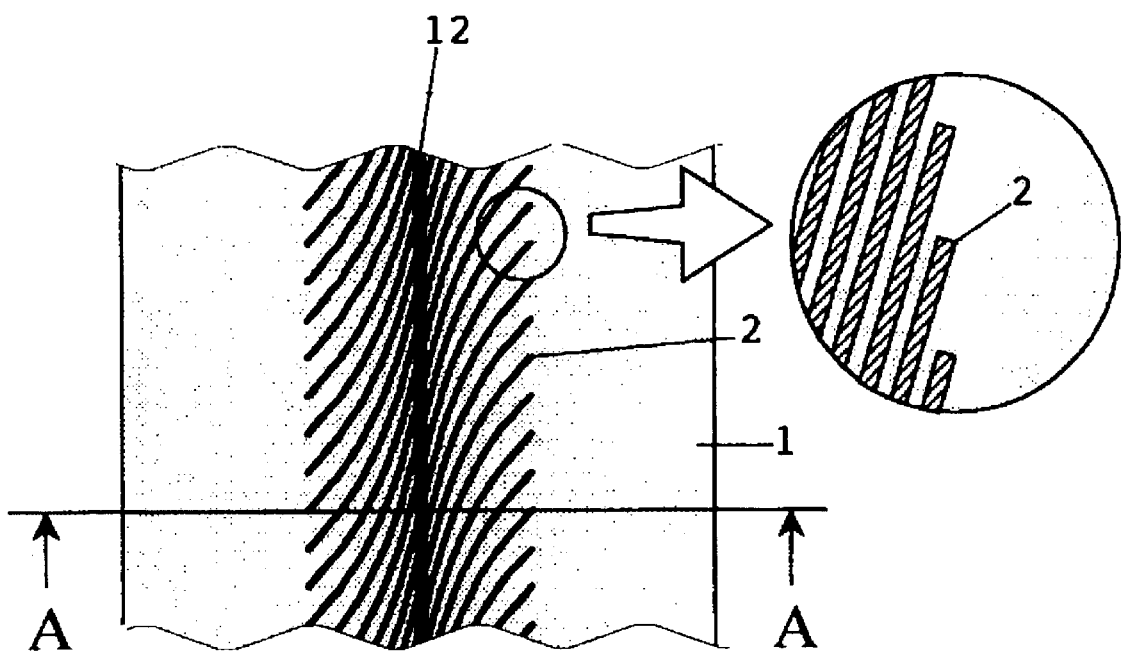
Figure 13A:
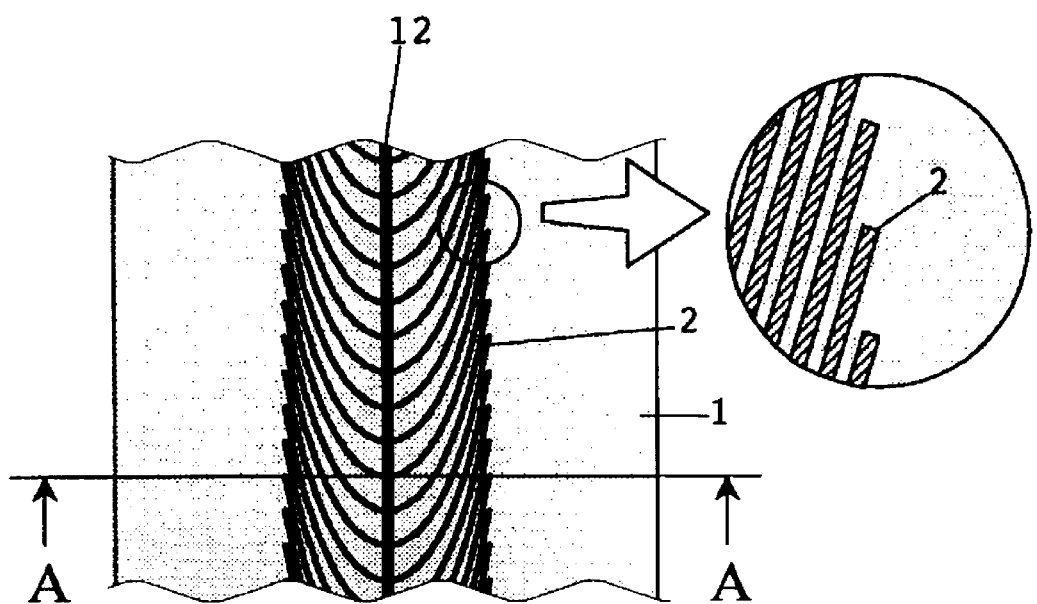
FIGS. 13A and 13B show configurations of other transmission lines according to the fifth embodiment.
Figure 13B:
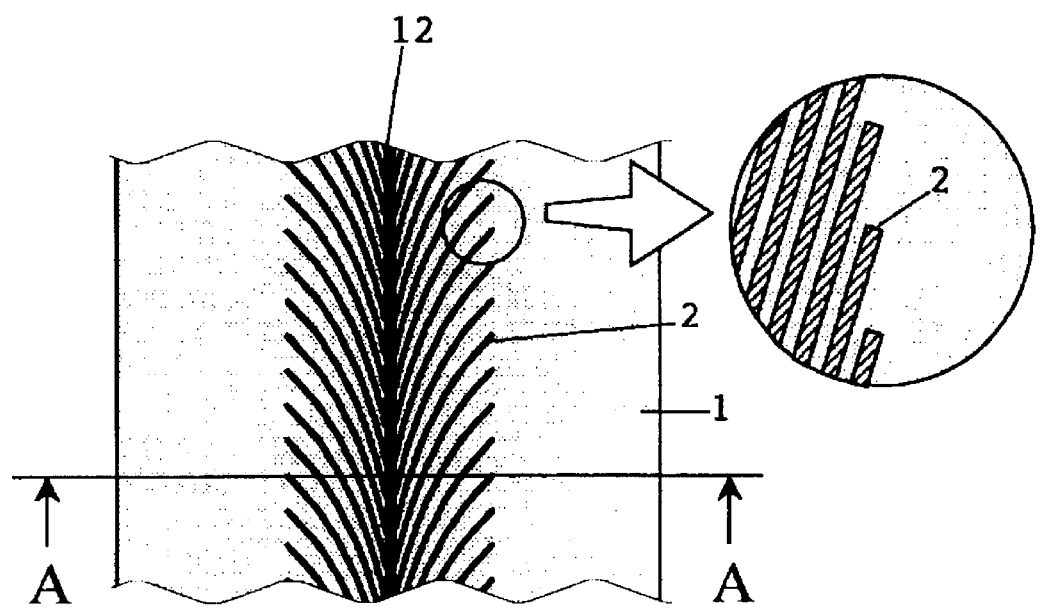

FIGS. 12A, 12B, 13A and 13B show plan views of four transmission lines that have four different patterns of thin lines 2. FIGS. 12A and 12B show two examples where the thin lines 2 branch diagonally in an upper right direction and a lower left direction from the continuous line 12; and FIGS. 13A and 13B show two examples in which the thin lines 2 branch symmetrically with respect to the central continuous line 12 as the symmetry axis.

In FIGS. 12A and 13A, the thin lines 2 are curved concavely toward the line 12. In FIGS. 12B and 13A, the thin lines 2 are curved convexly toward the line 12.

In any one of the transmission lines, by forming the thin lines 2 to be curved, capacitive coupling and mutual dielectric coupling between the thin lines 2 can be controlled more freely than in the case where the thin lines 2 are formed linearly. Also, this allows electrical lengths of the thin lines 2 to be adjusted while keeping their overall physical length constant.

Figure 14A:
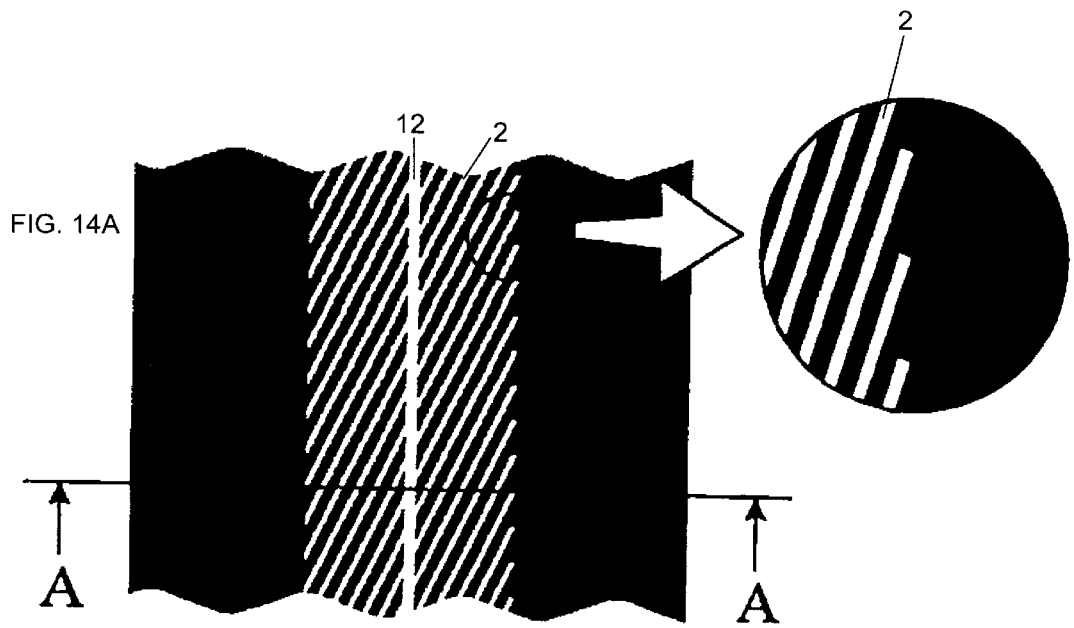
FIGS. 14A and 14B show a configuration of a transmission line according to a sixth embodiment.
Figure 14B:
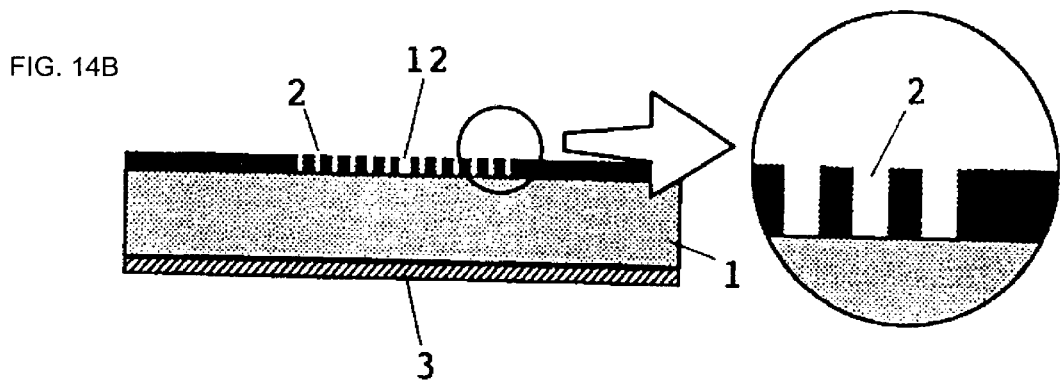

Sixth Embodiment (FIGS. 14A and 14B)

FIGS. 14A and 14B show a plan view and a cross-sectional view, respectively, together with partly-enlarged views thereof, of a sixth embodiment. As seen in FIG. 14B, unlike the lines shown in FIGS. 1A and 1B, thin lines 2 and a continuous line 12 are individually configured of slotted lines. In a transmission line composed of these slotted lines, the current concentration at the end is also reduced, and the transmission loss is reduced.

Figure 15A:
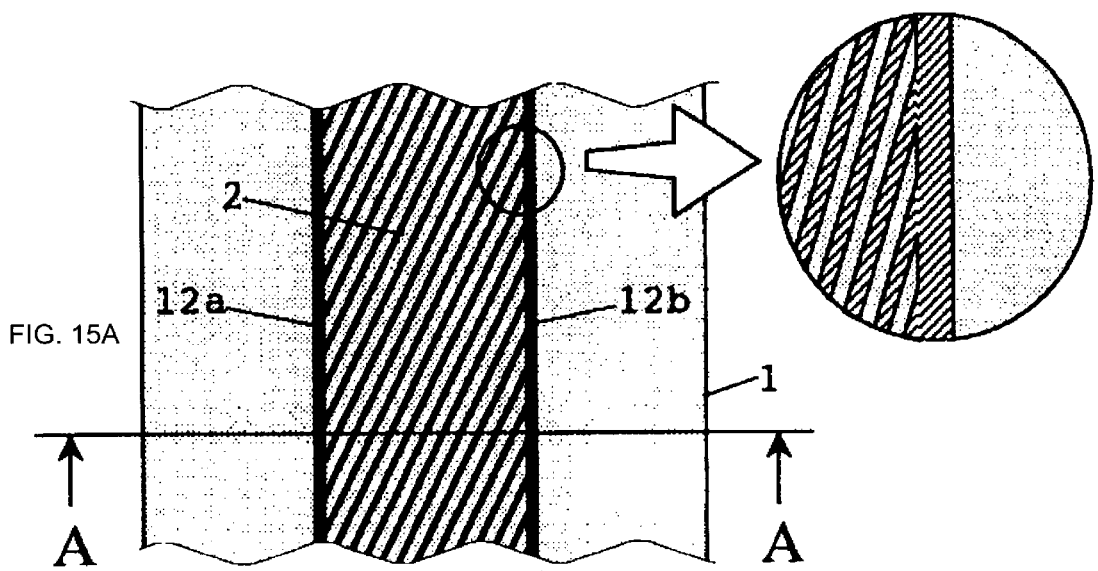
FIGS. 15A and 15B show a configuration of a transmission line according to a seventh embodiment.
Figure 15B:
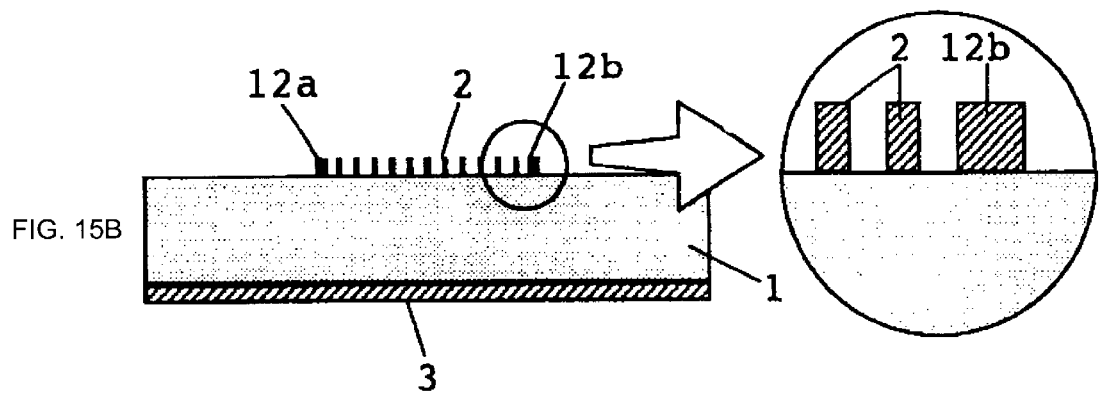

Seventh Embodiment (FIGS. 15A and 15B)

FIGS. 15A and 15B show a plan view and a cross-sectional view, respectively, together with partly-enlarged views thereof, of a seventh embodiment. In this example, two continuous lines 12a and 12b are provided. These continuous lines 12a and 12b are provided so that each end of each of the thin lines 2 is connected to a respective one of the lines 12a and 12b. According to this structure, each of the thin lines 2 works as a half-wavelength line in which both ends are short-circuited, and the continuous lines 12a and 12b connect antinode portions of the current amplitudes.

Figure 16A:
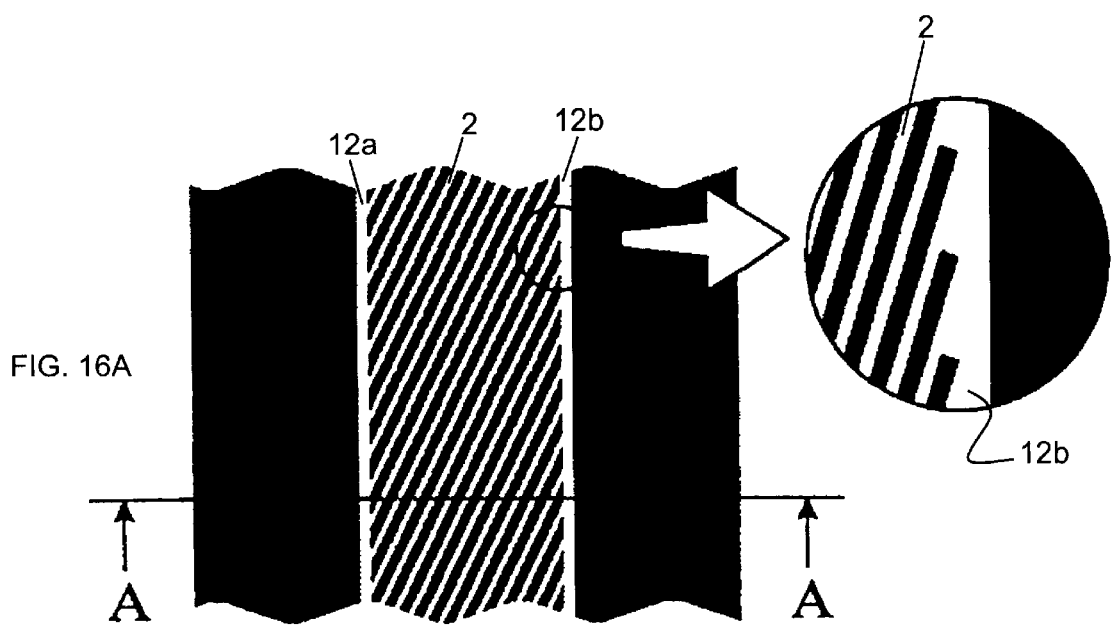
FIGS. 16A and 16B show a configuration of a transmission line according to an eighth embodiment.
Figure 16B:
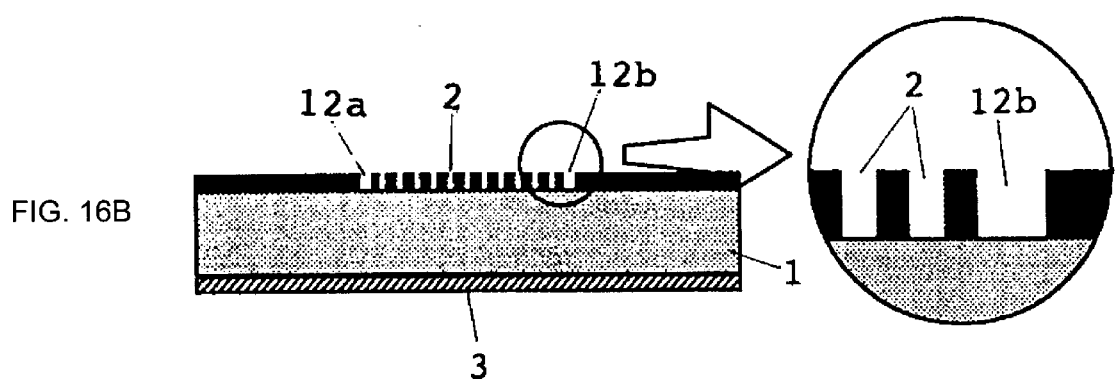

Eighth Embodiment (FIGS. 16A and 16B)

FIGS. 16A and 16B show a plan view and a cross-sectional view, respectively, together with partly-enlarged views thereof, of an eighth embodiment. In this example, as seen in FIG. 16B, two continuous lines 12a and 12b and thin lines 2 are individually configured of slotted lines, and these continuous lines 12a and 12b are provided so that each end of each of the thin lines 2 is connected to a respective one of the lines 12a and 12b. In a transmission line composed of these slotted lines, the current concentration at the end is also reduced, and the transmission loss is reduced.

Figure 17:
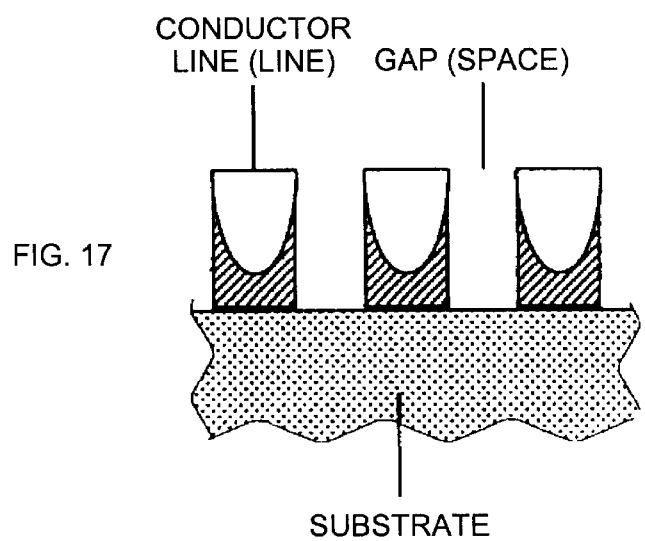
FIG. 17 is an enlarged cross-sectional view of a line portion of a transmission line according to a ninth embodiment.

Ninth Embodiment (FIG. 17)

FIG. 17 is an enlarged view of line portions of a ninth embodiment. The line width of each line is substantially the same as or smaller than the skin depth of the conductor. According to this, current flows for maintaining a magnetic flux that passes through a gap (space) between the right side of one conductor and the left side of the next conductor. This spacing is such that the left side current and the right side current interfere with each other. By this, reactive current that has a phase deviated from a resonant phase can be reduced; and as a result, the power loss can be significantly reduced.

Figure 18:
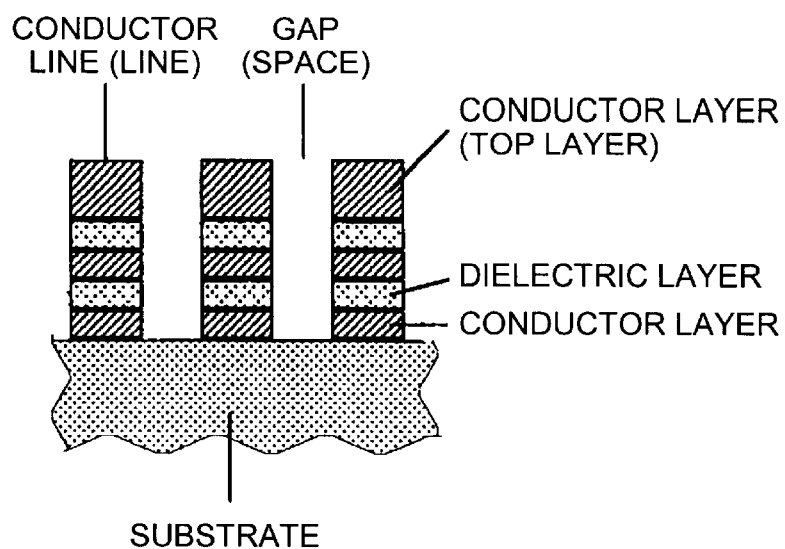
FIG. 18 is an enlarged cross-sectional view of a line portion of a transmission line according to a tenth embodiment.
Figure 19:
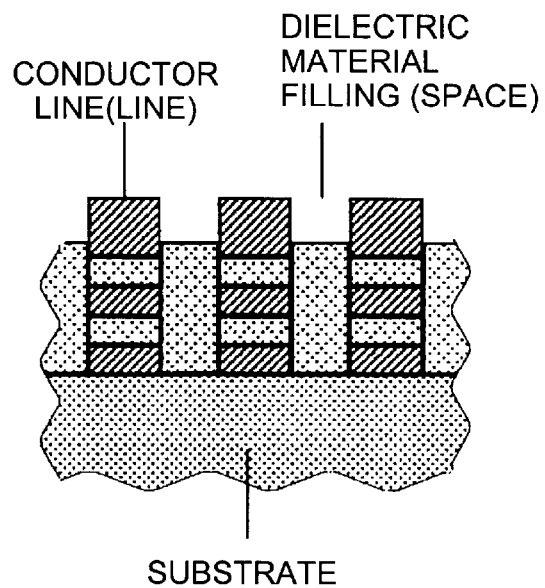
FIG. 19 is an enlarged cross-sectional view of a line portion of another transmission line according to the tenth embodiment.

Tenth Embodiment (FIGS. 18 and 19)

FIG. 18 is an enlarged view of line portions of a tenth embodiment. In this example, a thin-film conductor layer, a thin-film dielectric layer, a thin-film conductor layer, and a thin-film dielectric layer are overlaid on a surface of a dielectric substrate in that order. In addition, a conductor layer is provided as the top layer; thus configuring the line as a thin-film multilayered electrode in a three-layer structure. In this way, since the thin lines 2 are multilayered in the film-thickness direction, the skin effect at the surface of the substrate can be reduced, and the conductor loss can be further reduced.

FIG. 19 shows a case where a dielectric material is filled in each gap between the above-described thin-film multilayered electrodes. According to this structure, short-circuiting between the adjacent lines and short-circuiting between the layers can be easily prevented, thereby allowing improvement in reliability and stabilization in characteristics to be implemented.

Figure 20:
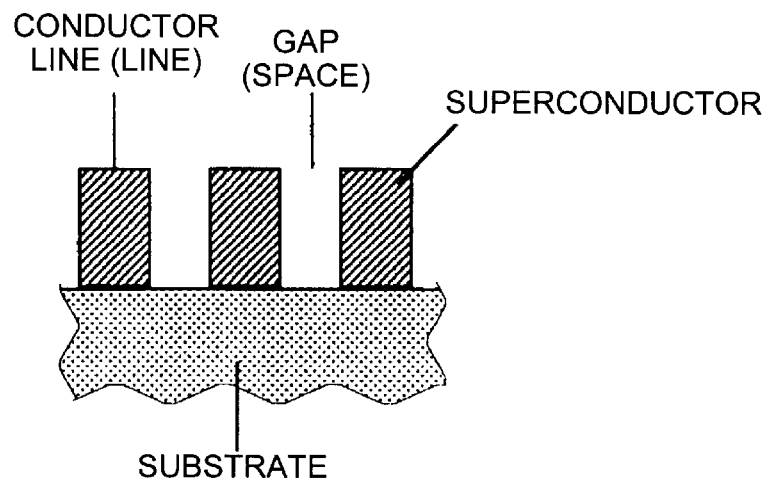
FIG. 20 is an enlarged cross-sectional view showing a line portion of a transmission line according to an eleventh embodiment.

Eleventh Embodiment (FIG. 20)

FIG. 20 is an enlarged view of conductor portions of an eleventh embodiment. In this example, superconductors are used as electrodes. For example, an Yttrium-group or Bismuth-group high-temperature superconductor material is used. Generally, when a superconductor material is used for the electrodes, an upper limit of the current density must be determined so that withstand-power characteristics are not reduced. However, according to the configuration with one continuous line and the plurality of thin lines branched therefrom, the line portions have no substantial edge sections. Therefore, no significant current concentration occurs, allowing operation to be easily performed at a level lower than the critical current density of the superconductor. As a result, low-loss characteristics of the superconductor can be efficiently used.

Twelfth Embodiment (FIGS. 21A to 21D)

Figure 21A:
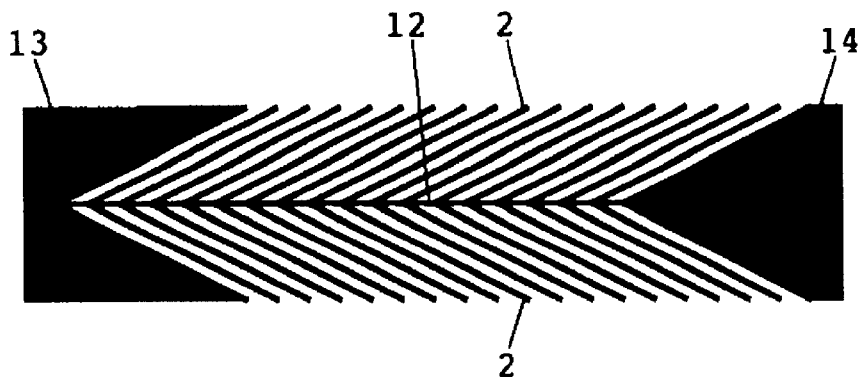
FIG. 21A shows a configuration of an exemplary resonator according to a twelfth embodiment.
Figure 21B:
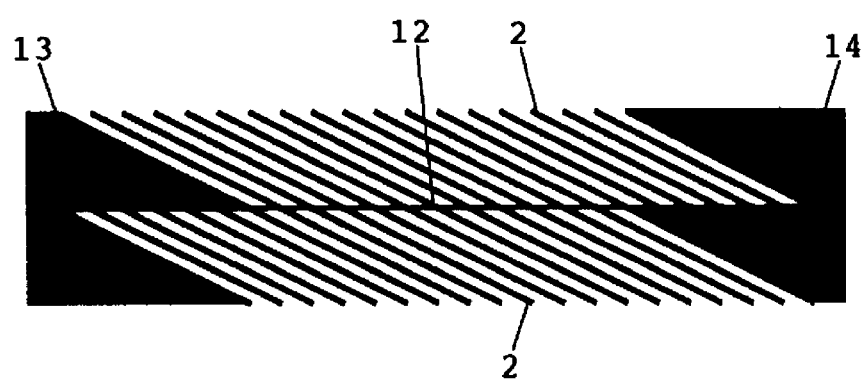
FIG. 21B shows a configuration of another exemplary resonator according to the twelfth embodiment.
Figure 21C:
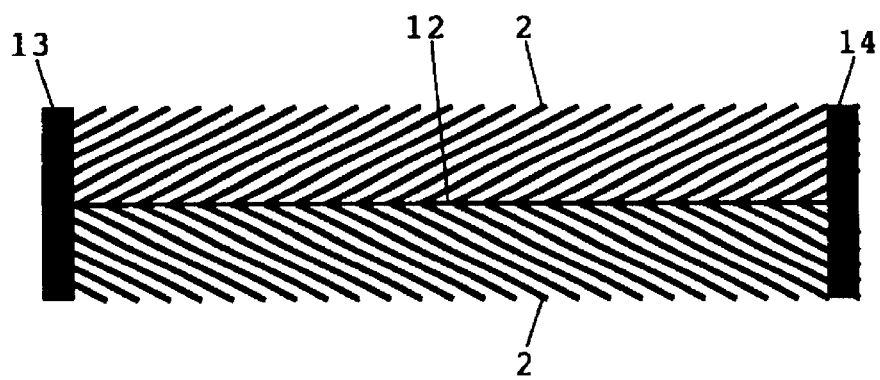
FIG. 21C shows a configuration of another exemplary resonator according to the twelfth embodiment.
Figure 21D:
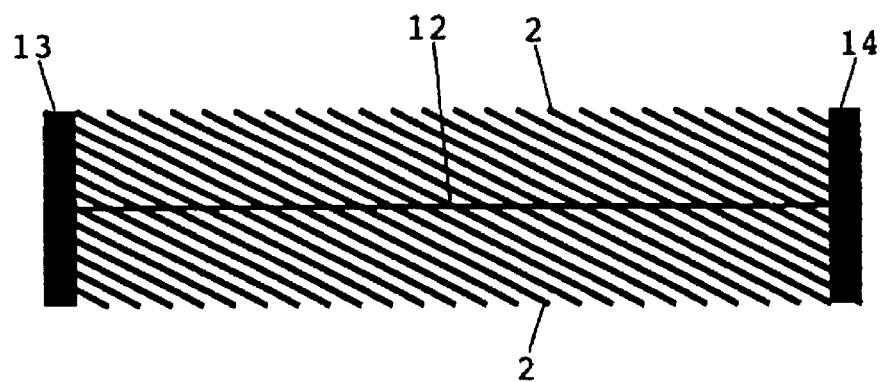
FIG. 21D shows a configuration of another exemplary resonator according to the twelfth embodiment.

FIGS. 21A to 21D show four examples of resonators that use the above-described transmission lines as resonant lines. In FIGS. 21A and 21C, there are shown examples in each of which thin lines 2 are formed in bilateral symmetry with respect to a central continuous line 12. In FIGS. 21B and 21D, each structure is such that central portions of linear thin lines 2 are connected to each other via a continuous line 12. In the examples shown in FIGS. 21A and 21B, end terminals 13 and 14 are formed such that line lengths of the thin lines 2 are all the same. In the examples shown in FIGS. 21C and 21D, end terminals 13 and 14 are formed only at both ends of the resonant line.

Figure 22A:
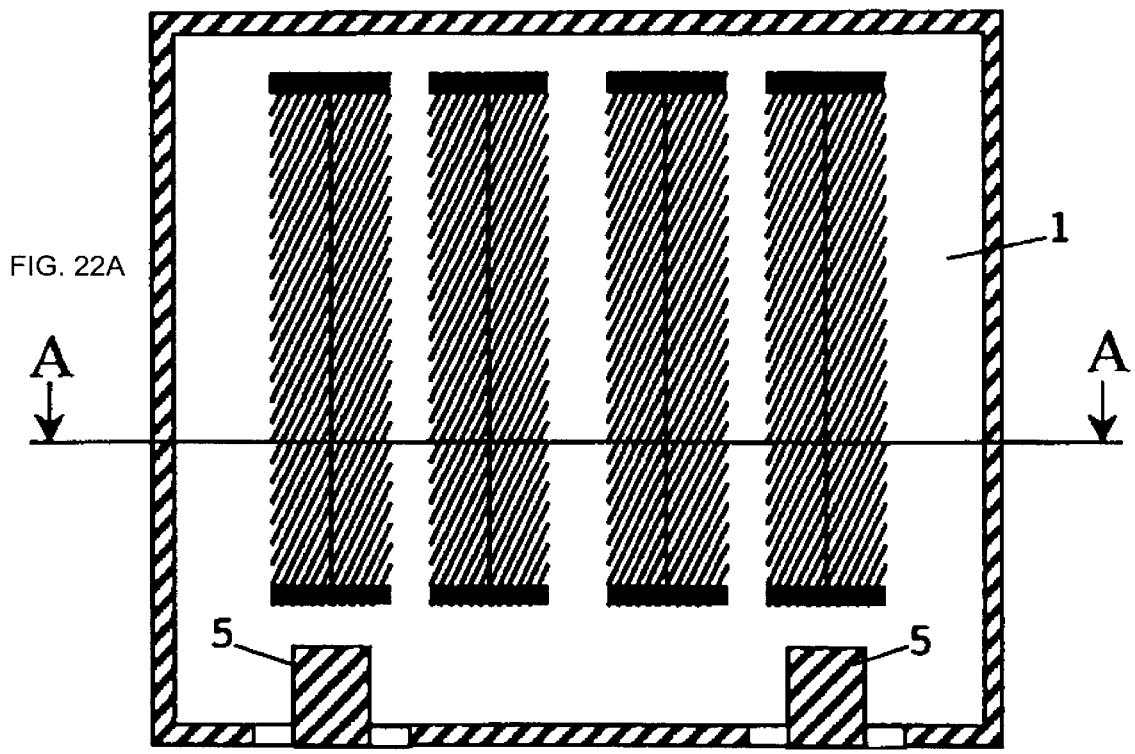
FIGS. 22A and 22B show a configuration of a filter according to a thirteenth embodiment.
Figure 22B:
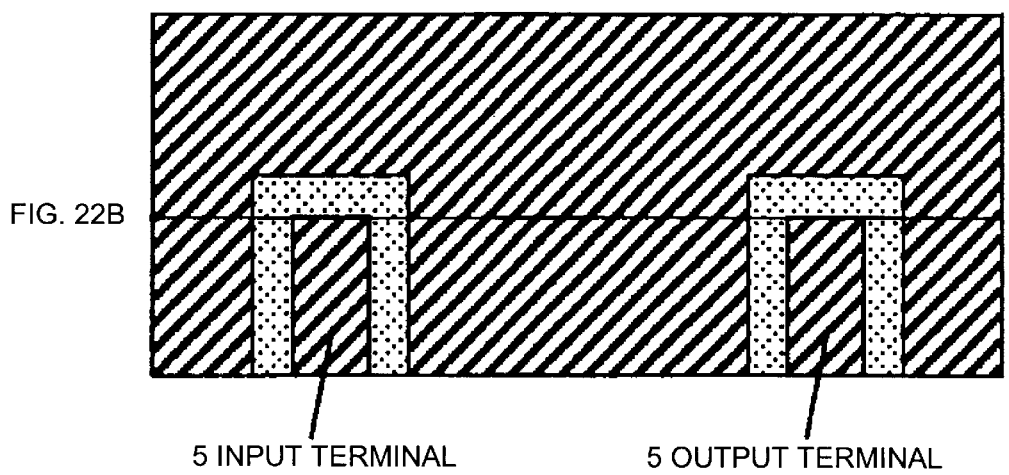

Thirteenth Embodiment (FIGS. 22A and 22B)

FIGS. 22A and 22B show a configuration of a filter, in which FIG. 22A shows a top view of a dielectric substrate 1 on which resonant lines are formed, and FIG. 22B is a side view of the entire configuration of the filter. On an upper surface of the dielectric substrate 1, there are arranged four transmission lines that are similar to those shown in FIG. 21D; and external-coupling electrodes 5 for capacitively coupling the respective resonant lines are formed at both ends. The external-coupling electrodes 5 extend to a front surface (outer surface) as an input terminal and an output terminal. Ground electrodes are formed on a lower surface and four peripheral surfaces of the dielectric substrate 1. Also, another dielectric substrate 1' having ground electrodes formed on an upper surface and four peripheral surfaces is formed on the dielectric substrate 1. By this, a filter using triplet-structured resonators is configured.

According to the above-described structure, adjacent resonators are dielectrically coupled, thereby, a filter that is formed of four resonators and that provides bandpass characteristics is obtained.

Figure 23:
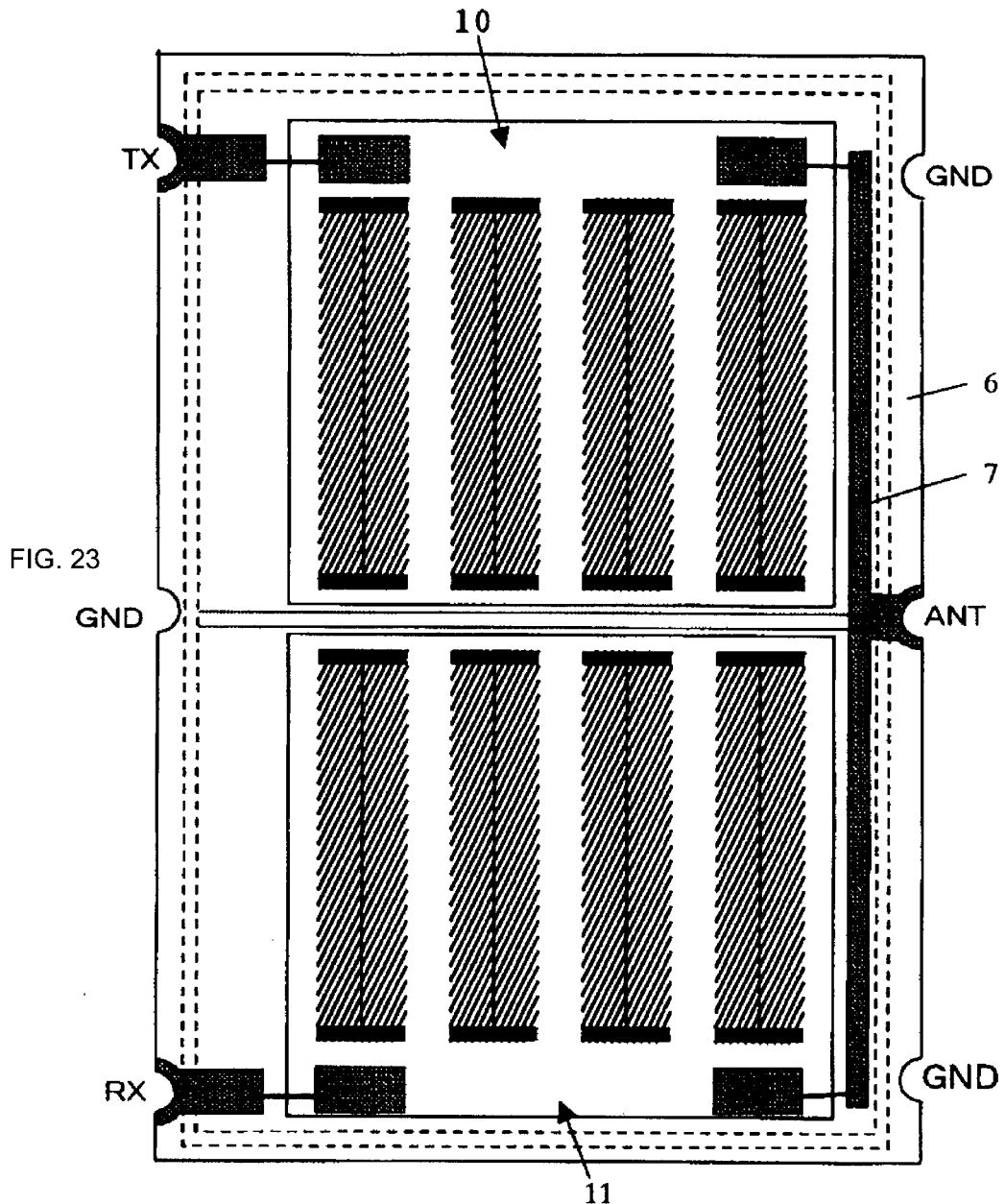
FIG. 23 shows a configuration of a duplexer according to a fourteenth embodiment.
Figure 24:
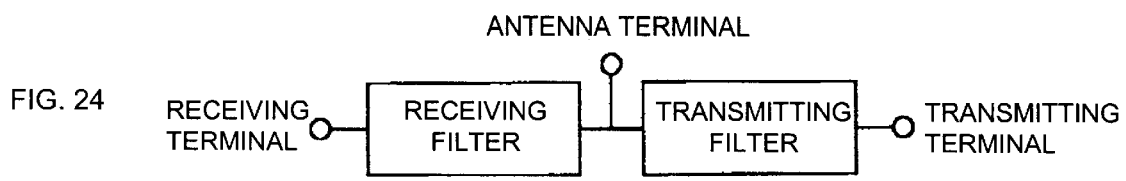
FIG. 24 is a block diagram of the aforementioned duplexer.

Fourteenth Embodiment (FIGS. 23 and 24)

FIG. 23 is a view showing the configuration of a duplexer and is a top view showing a state where an upper shield cover is removed. In the FIGS. 10 and 11 denote filters each having the configuration of the dielectric substrate portion shown in FIGS. 22A and 22B. The filter 10 is used as a transmitting filter, and the filter 11 is used as a receiving filter. The filters 10 and 11 are mounted on an upper surface of an insulating substrate 6. On the substrate 6, there are formed a branching line 7, an ANT terminal, a TX terminal, and an RX terminal, to which external-coupling electrodes of the filters 10 and 11 and electrode portions of the substrate 6 are wire-bonded. A ground electrode GND is formed substantially on the entire lower surface excluding the terminal portions of the insulating substrate 6. The shield cover is mounted on the upper portion indicated by dotted lines in the figure.

FIG. 24 is a block diagram of the duplexer. According to this structure, intrusion of transmitted signals to a receiver circuit and intrusion of received signals to a transmitter circuit can be prevented. Also, transmitted signals from the transmitter circuit are limited by a transmitting filter to a transmitting-frequency band and are guided to an antenna; and received signals from the antenna are limited by a receiving filter to a receiving-frequency band and are fed to a receiver.

Figure 25:
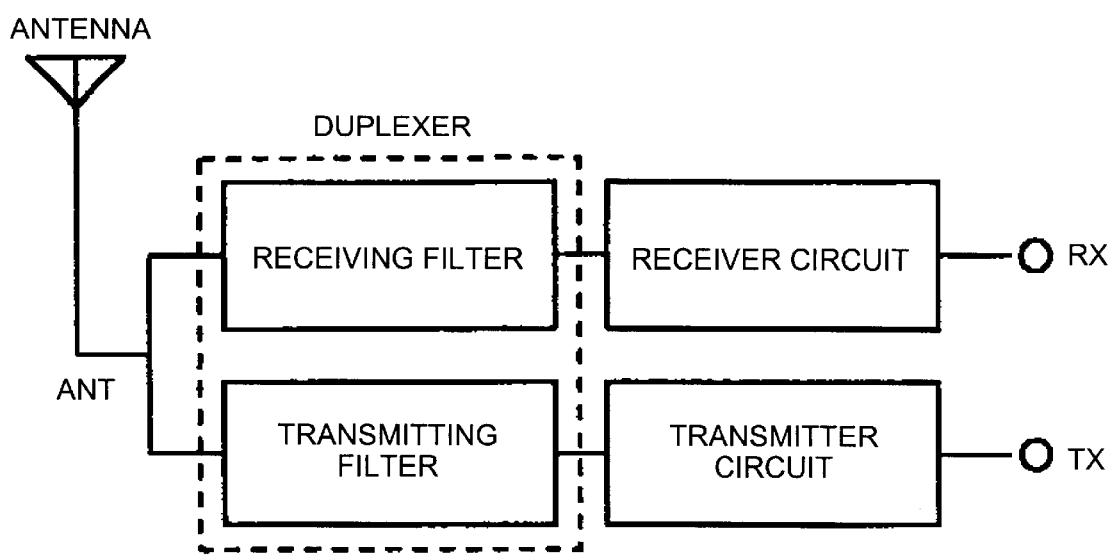
FIG. 25 is a block diagram showing a configuration of a communication apparatus according to a fifteenth embodiment.

Fifteenth Embodiment (FIG. 25)

FIG. 25 is a block diagram of the configuration of a communication apparatus according to a fifteenth embodiment. In this, a duplexer has the configuration shown in FIGS. 23 and 24, comprising a transmitting filter and a receiving filter. A transmitter circuit and a receiver circuit are configured on a circuit substrate, the transmitter circuit is connected to the TX terminal, the receiver circuit is connected to the RX terminal, and an antenna is connected to the ANT terminal. In this way, the duplexer is mounted on the aforementioned circuit substrate.

Although embodiments of the transmission line, resonator, filter, duplexer, and communication apparatus according to the present invention have been described, it is to be understood that the invention is not restricted to the described embodiments. On the contrary, the invention is intended to cover various other modifications and equivalent arrangements included within the spirit and scope of the invention.

What is claimed is:

1. A transmission line comprising a continuous line and a plurality of thin lines each branching from said continuous line and each having a predetermined common overall length, wherein a line width of each of said plurality of thin lines is not more than the skin depth at desired frequency of said plurality of thin lines.

2. The transmission line according to claim 1, wherein the branching direction of each of said plurality of thin lines is slanted with respect to said continuous line and the thin lines branch from each side of the continuous line and are substantially parallel to each other.

3. The transmission line according to one of claims 1 and 2, further comprising first and second connecting lines each on a respective side of and substantially parallel to said continuous line, wherein said plurality of thin lines on each side of the continuous line are connected to each other by the corresponding one of said connecting lines, and said corresponding connecting line connects corresponding portions of each of said plurality of thin lines on said respective side.

4. The transmission line according to claim 1, wherein said plurality of thin lines are curved lines, and either capacitive coupling or mutual dielectric coupling exists between each adjacent pair of said thin lines.

5. The transmission line according to claim 1, wherein each of said plurality of thin lines comprises a thin-film multilayered electrode formed by overlaying thin-film dielectric layers and thin-film conductor layers.

6. The transmission line according to claim 5, further comprising a dielectric material filled in a gap between each pair of said plurality of thin lines that are adjacent to each other.

7. A resonator comprising:
  the transmission line according to claim 1; and
  a pair of terminals connected respectively to ends of said continuous line.

8. A filter comprising a plurality of resonators according to claim 7; an input terminal coupled to a terminal of one of said resonators; and an output terminal coupled to a terminal of another one of said resonators.

9. A communication apparatus comprising:
   a high frequency circuit comprising at least one of a transmitting circuit and a receiving circuit; and
   the filter according to claim 8, wherein at least one of said input terminal and said output terminal of said filter is connected to said high frequency circuit.

10. A duplexer comprising a transmitting filter and a receiving filter, an output terminal of said transmitting filter and an input terminal of said receiving filter being connected in common to an antenna terminal, at least one of said transmitting and receiving filters being a filter according to claim 8.

11. A communication apparatus comprising the duplexer according to claim 10;
   a transmitting circuit connected to an input terminal of said transmitting filter; and
   a receiving circuit connected to an output terminal of said receiving filter.

* * * * *